(12) United States Patent
McDaniel

(10) Patent No.: US 6,400,189 B2
(45) Date of Patent: Jun. 4, 2002

(54) BUFFER CIRCUIT

(75) Inventor: Bart R. McDaniel, Phoenix, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,743

(22) Filed: Dec. 14, 1999

(51) Int. Cl.⁷ .............................. H03B 1/00; H03K 3/00
(52) U.S. Cl. ..................... 327/108; 327/390; 327/103; 327/333; 326/83; 326/88
(58) Field of Search ............................ 326/83, 81, 80, 326/88; 327/77, 78, 85, 112, 124, 333, 390, 309, 315, 318, 327, 319, 328, 102, 103, 108; 361/56, 90, 91.1, 91.2

(56) References Cited

U.S. PATENT DOCUMENTS

| | | | | |
|---|---|---|---|---|
| 5,172,019 A | * | 12/1992 | Naylor et al. | 327/390 |
| 5,514,994 A | * | 5/1996 | Sawada | 327/390 |
| 5,712,586 A | * | 1/1998 | Kitao | 327/333 |
| 5,801,556 A | * | 9/1998 | LeFevre | 327/103 |
| 5,801,569 A | * | 9/1998 | Pinkham | 327/333 |
| 5,818,258 A | * | 10/1998 | Choi | 326/83 |
| 5,872,469 A | * | 2/1999 | Nestler | 327/91 |
| 5,994,966 A | * | 11/1999 | Stikvoort | 327/434 |
| 6,177,819 B1 | * | 1/2001 | Nguyen | 327/108 |

* cited by examiner

Primary Examiner—Terry D. Cunningham
Assistant Examiner—Long Nguyen
(74) Attorney, Agent, or Firm—Trop, Pruner & Hu, P.C.

(57) ABSTRACT

A buffer circuit includes an amplifier, a pass gate circuit and a level shifter. The pass gate circuit communicates an input signal to the amplifiers and includes a terminal to control the communication. A level shifter furnishes a control signal to the terminal of the pass gate circuit and regulates the control signal based on a magnitude of the input signal.

32 Claims, 2 Drawing Sheets

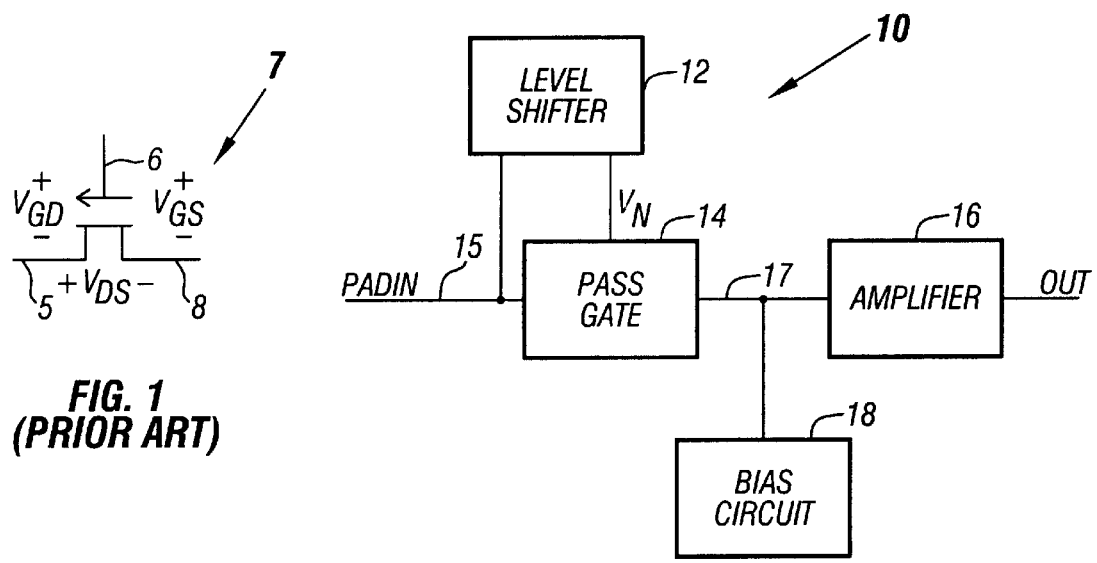
FIG. 1
(PRIOR ART)
FIG. 2
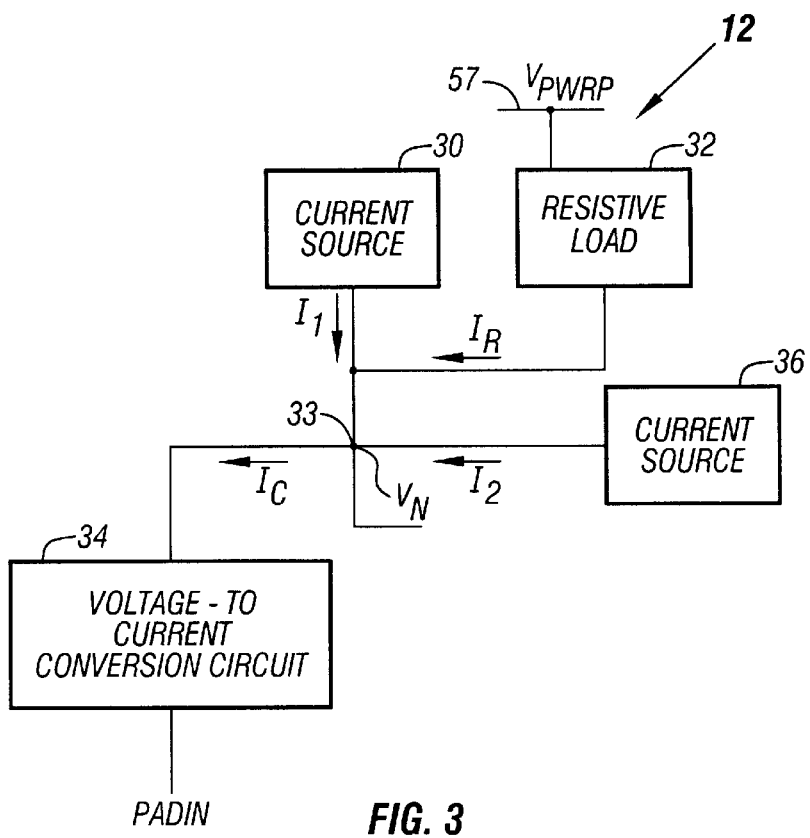
FIG. 3

BUFFER CIRCUIT

BACKGROUND

The invention generally relates to a buffer circuit, such as an input buffer, for example.

A buffer circuit, or buffer, is an electrical circuit that typically is used for purposes of preventing one circuit from electrically loading another circuit while passing a signal between the circuits. For example, an output buffer may be used to communicate a signal from a circuit to a load that has a low impedance while preventing the circuit from experiencing the large current fluctuations that are associated with driving a low impedance load.

Similarly, an input buffer may be used to, for example, receive a signal from a conductive line of a bus and provide an indication of the signal to digital circuitry that, in turn, processes the signal. The digital circuitry may not be capable of receiving the signal directly from the bus due to such factors as an incompatible voltage level of the bus line or a large capacitance of the bus line, as just a few examples.

A typical input buffer may include an amplifier that has input terminals for receiving the input signal and output terminals for furnishing an output signal that is indicative of the input signal. The amplifier or other circuitry of the buffer may be damaged if an input signal (such as an electrostatic discharge (ESD) signal, for example) is received by this circuitry when the input buffer is not powered up. For purposes of preventing this damage from occurring, the input buffer may include a pass gate that is coupled between an input terminal of the buffer and the input terminal of the amplifier. In this manner, the pass gate does not conduct and thus, blocks communication of the input signal when the input buffer is powered down, and the pass gate conducts when the input buffer is powered up.

As an example, the pass gate may be formed from an n-channel metal-oxide-semiconductor field-effect-transistor (NMOSFET) 7, a device that is depicted in FIG. 1. A drain terminal 5 of the NMOSFET 7 may function as the input terminal of the input buffer to receive an input signal to the input buffer, and a source terminal 8 of the NMOSFET 7 may be coupled to the input terminal of the amplifier. When the input buffer is powered up, a positive voltage is applied to a gate terminal 6 of the NMOSFET 7 to establish a sufficient positive gate-to-source voltage (called $V_{GS}$) to cause the NMOSFET 7 to conduct and communicate the input signal to the amplifier. Typically, the $V_{GS}$ voltage is large enough to place the NMOSFET 7 in its linear resistive region, a region in which a voltage difference (called $V_{DS}$) between the drain 5 and source 8 terminals is near zero volts. To keep the $V_{GS}$ voltage large enough to keep the NMOSFET 7 in the linear resistive region, a relatively large constant turn on voltage may be applied to the gate terminal 6 to accommodate fluctuations in the voltage of the source terminal 8 due to fluctuations in the input signal. In this manner, the $V_{GS}$ voltage decreases when the input signal increases. Unfortunately, the gate-to-drain voltage (called $V_{GD}$) of the NMOSFET 7 also varies inversely with the level of the input signal and has a maximum gate-to-drain voltage may not be exceeded without damaging the NMOSFET 7. Therefore, this criteria limits the voltage level that is selected for the gate turn on voltage and thus, limits the permissible voltage swing of the input signal.

Thus, there is a continuing need for an arrangement that addresses one or more of the problems that are stated above.

SUMMARY

In an embodiment of the invention, an input signal is communicated to an amplifier using a pass gate circuit. A control voltage is provided to the pass gate circuit, and the control voltage is regulated in response to a magnitude of the input signal.

Advantages and other features of the invention will become apparent from the following description, drawing and claims.

BRIEF DESCRIPTION OF THE DRAWING

FIG. 1 is a schematic diagram of a transistor of the prior art.

FIG. 2 is a schematic diagram of an input buffer according to an embodiment of the invention.

FIG. 3 is a schematic diagram of a level shifter of the input buffer of FIG. 2 according to an embodiment of the invention.

DETAILED DESCRIPTION

Figure 4:
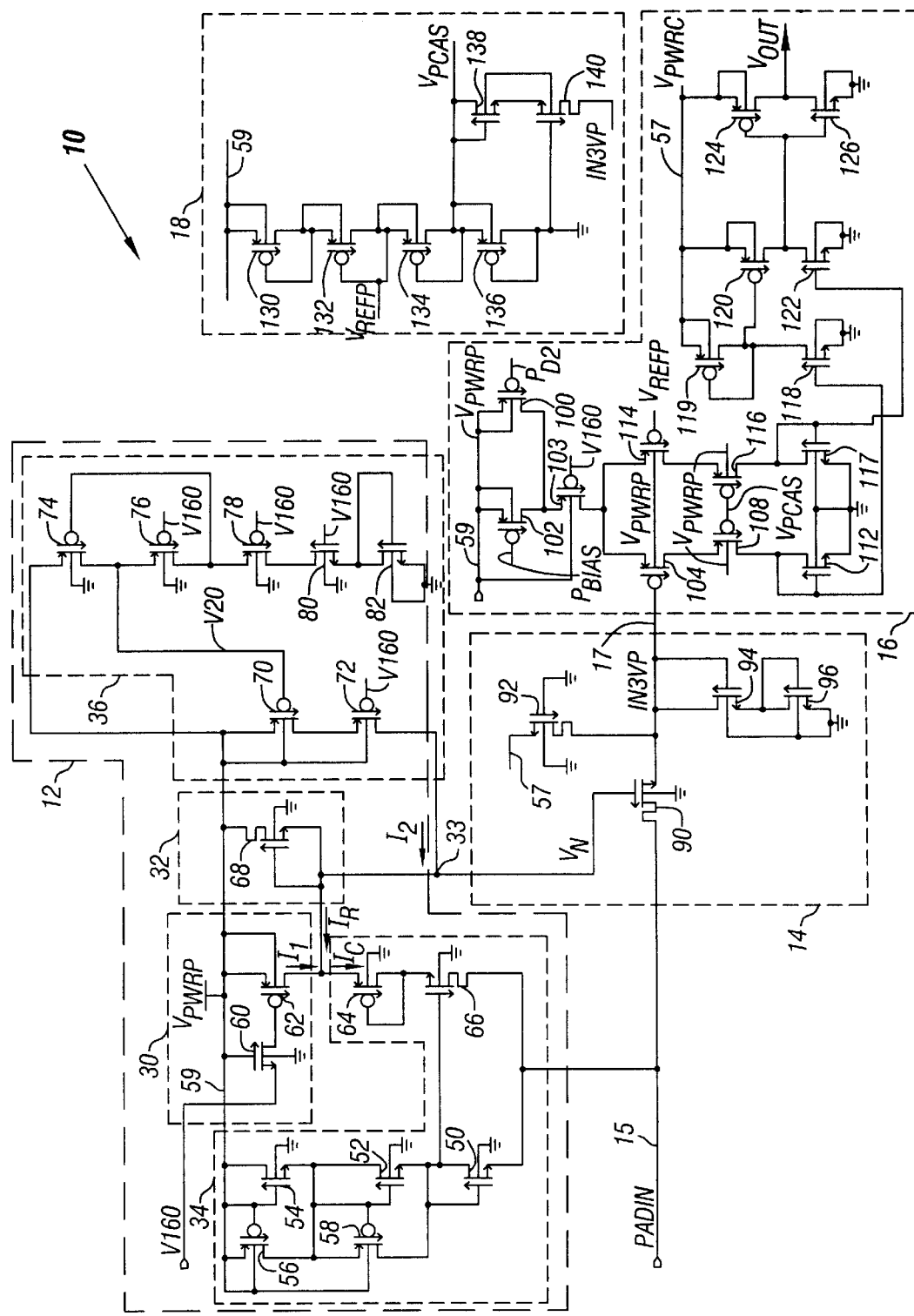
FIG. 4 is a more detailed schematic diagram of the input buffer of FIG. 2 according to an embodiment of the invention.

Referring to FIG. 2, an embodiment 10 of an input buffer in accordance with the invention includes a pass gate 14 to prevent damage to an amplifier 16 of the buffer 10 when the buffer 10 is not powered up. In this manner, the pass gate 14 receives a signal (called $V_N$) that controls the communication of an input signal (called PADIN) from an input terminal 15 of the buffer 10 to an input terminal 17 of the amplifier 16. When the input buffer 10 is not powered up, the $V_N$ signal has a voltage level near or below a cutoff voltage (zero volts, for example), a voltage that keeps the pass gate 14 from communicating the PADIN signal to the input terminal 17 of the amplifier 16. However, when the input buffer 10 is powered up, the $V_N$ signal has a voltage that, in general, causes the pass gate 14 to conduct and communicate the PADIN signal between the input terminals 15 and 17. In the proceeding description, it is assumed that the input buffer 10 is powered up.

Unlike conventional input buffers, the input buffer 10 does not set a turn on voltage level of the $V_N$ signal to a nearly constant level, but rather, the input buffer 10 includes a level shifter 12 to generate the $V_N$ signal and regulate the voltage level of the $V_N$ signal in a manner that maximizes the permissible range of the PADIN signal. In this manner, the level shifter 12 receives the PADIN signal and adjusts the turn on level of the $V_N$ signal based on the magnitude, or level, of the PADIN signal. For example, in some embodiments, the level shifter 12 generally increases the voltage level of the $V_N$ signal when the PADIN signal increases and generally decreases the voltage level of the $V_N$ signal when the PADIN signal decreases. For embodiments where the pass gate 14 may be formed from a metal-oxide-semiconductor field-effect-transistor (MOSFET), for example, the $V_N$ signal may be received by a gate terminal of the MOSFET. Therefore, for these embodiments, the level shifter's adjustment of the $V_N$ signal permits a relatively large signal swing (as compared to conventional arrangements) in the PADIN voltage without exceeding the maximum gate-to-drain voltage rating or the maximum gate-to-source voltage rating of the MOSFET.

Referring to FIG. 3, in some embodiments, the level shifter 12 may include a resistive load 32 that is coupled between a conductive line 59 that furnishes an upper power supply voltage (called $V_{PWRP}$) and a node 33 that furnishes the $V_N$ signal. The level shifter 12 adjusts a current (called $I_R$) through the resistive load 32 to adjust the level of the $V_N$ voltage. As depicted in FIG. 3, the $I_R$ current has a positive orientation toward the node 33. The level shifter 12 decreases the $I_R$ current to increase the $V_N$ voltage and increases the $I_R$ current to decrease the $V_N$ voltage, as described below. To accomplish this, the level shifter 12 includes a voltage-to-current conversion circuit 34 that furnishes an output current (called $I_C$) and regulates the magnitude, or level, of the $I_C$ current based on the level of the PADIN voltage.

More particularly, the $I_C$ current has a positive orientation away from the node 33, as depicted in FIG. 2. The circuit 34 increases the level of the $I_C$ current in response to a decrease in the level of the PADIN signal, an event that increases the level of the $I_R$ current. The circuit 34 decreases the level of the $I_C$ current in response to an increase in the level of the PADIN signal, an event that decreases the level of the $I_C$ current. Due to this relationship, an increase in the PADIN signal causes a corresponding increase in the $V_N$ signal, and a decrease in the PADIN signal causes a corresponding decrease in the $V_N$ signal.

In some embodiments, the level shifter 12 may also include two circuits that contribute relatively constant currents to the node 33; a current source 36 that furnishes a current called $I_2$ and a current source 30 that furnishes a current called $I_1$. Each of the $I_1$ and $I_2$ currents has a positive orientation toward the node 33. The current level of the current source 30 is selectable to permit two different modes of operation of the level shifter 12 depending on the voltage swing range of the PADIN signal. In this manner, if the PADIN signal remains in a low voltage range, the current source 30 may be placed in a mode in which the current source 30 furnishes a larger $I_1$ current level, a level that generally decreases the level of the $V_N$ signal to match the low voltage range. Similarly, if the PADIN signal remains in a high voltage range, the current source 30 may be placed in a mode in which the current source 30 furnishes a smaller $I_1$ current level, a level that generally increases the level of the $V_N$ signal to match the high voltage range.

FIG. 4 depicts a more detailed schematic diagram of the input buffer. Other implementations are possible. As illustrated in FIG. 4, in some embodiments, the voltage-to-current conversion circuit 34 includes an n-channel MOSFET (NMOSFET) 54 that has its drain terminal coupled to the positive voltage supply line 59 that furnishes the $V_{PWRP}$ voltage. The source terminal of the NMOSFET 54 is coupled to the drain terminal of an NMOSFET 52, and the source terminal of the NMOSFET 52 is coupled to the drain terminal of another NMOSFET 50. The source terminal of the NMOSFET 50 is coupled to the input terminal 15 of the input buffer. The gate terminal of each NMOSFET 50, 52 and 54 is coupled to its drain terminal. Thus, the potential difference between the $V_{PWRP}$ supply voltage and the PADIN signal is formed by the gate-to-source voltages of the NMOSFETs 50, 52 and 54, a design that causes the current level through the drain-source paths of the NMOSFETs 50, 52 and 54 to increase when the voltage level of the PADIN signal decreases and decrease when the voltage level of the PADIN signal increases.

The voltage-to-current conversion circuit 34 also includes two p-channel MOSFETs (PMOSFETs) 56 and 58 that are arranged to function as substantially constant current sources, as the source-to-gate terminals of the PMOSFETs 56 and 58 are coupled together. The source terminal of the PMOSFET 56 is coupled to the supply voltage line 59, and the drain terminal of the PMOSFET 56 is coupled to the drain terminal of the NMOSFET 52 and the source terminal of the PMOSFET 58. The drain terminal of the PMOSFET 58 is coupled to the drain terminal of the NMOSFET 50. Thus, the current in the drain-source path of the NMOSFET 50 is a result of the combined PADIN dependent current that is established by the NMOSFETs 50, 52 and 54 and the substantially constant current that is established by the PMOSFETs 56 and 58.

A vertical drain NMOSFET (VDNMOSFET) 66 of the circuit 34 has its drain terminal coupled to the input line 15 and its source terminal coupled to the drain terminal of a PMOSFET 64. The PMOSFET 64 has its drain terminal coupled to its gate terminal to form an active load. The source terminal of the PMOSFET is coupled to the node 33 and receives the $I_C$ current. Due, to the above-described arrangement, the voltage between the gate and drain terminals of the VDNMOSFET 66 controls the current through its source-drain path. The gate terminal of the VDNMOSFET 66 is coupled to the gate terminal of the NMOSFET 50, an arrangement that causes the $I_C$ current to mirror the current in the drain-source path of the NMOSFET 50.

In some embodiments, the adjustable current source 30 includes a PMOSFET 62 that has its source terminal coupled to the supply voltage line 59 and its drain terminal coupled to the node 33. The drain terminal of the PMOSFET 62 furnishes the $I_1$ current. The current source 30 also includes a NMOSFET 60 that has its drain terminal coupled to the gate terminal of the PMOSFET 62. The source terminal of the NMOSFET 60 receives a signal (called V160) that sets the mode of the input buffer 10. In this manner, when the V160 has a first voltage level (1.6 volts, for example), the NMOSFET 60 establishes this voltage level at the gate terminal of the PMOSFET 62 to lower the $I_1$ current, an event that lowers the $I_R$ current level and increases the $V_N$ voltage level to permit a high range of PADIN voltages.

However, when the V160 signal has a lower second voltage level (0 volts, for example), the NMOSFET 60 establishes the second voltage level at the gate terminal of the PMOSFET 62 to establish a higher $I_1$ current, a current that causes a higher $I_R$ current level and decreases the $V_N$ voltage level to permit a lower range of PADIN voltages.

In some embodiments, the current source 36 of the level shifter 12 may include PMOSFETs 70 and 72 that have their source-drain paths serially coupled together. The source terminal of the PMOSFET 70 is coupled to the supply voltage line 59, and the drain terminal of the PMOSFET 72 furnishes the $I_2$ current. The gate terminal of the PMOSFET 72 receives the V160 signal, and the gate terminal of the PMOSFET 70 receives a bias voltage called V20. Both the V160 and V20 voltages have higher voltages levels when the input buffer 10 is in a mode to receive higher input signals so that the 12 current has a lower level in this mode to generally reduce the level of the $V_N$ signal. Similarly, both the V160 and V20 voltages have higher lower levels when the input buffer 10 is in a mode to receive lower input signals to generally increase the level of the $V_N$ signal.

The V20 voltage is furnished by a voltage reference circuit (of the level shifter 12) that includes a PMOSFET 74 that has its source terminal coupled to the supply voltage line 59. The drain terminal of the PMOSFET 74 furnishes the V20 signal. The voltage reference circuit also includes a PMOSFET 76 that has its source terminal coupled to the drain terminal of the PMOSFET 74 and its drain terminal coupled to the source terminal of another PMOSFET 78. The drain terminal of the PMOSFET 78, in turn, is coupled to the source terminal of a PMOSFET 80 that has its drain terminal coupled to the source terminal of a PMOSFET 82. The gate terminal of the PMOSFET 74 is coupled to the drain terminal of the PMOSFET 76, and the source terminal of the PMOSFET 82 is coupled to gate terminal of the PMOSFET 82. The drain terminal of the PMOSFET 82 is coupled to ground. The gate terminals of the PMOSFET 76, 78 and 80 receive the V160 signal.

In some embodiments, the pass gate 14 includes a VDNMOSFET 90 that has its drain terminal coupled to the input terminal 15 of the buffer 10 and its source coupled to the input line 17 of the amplifier 16. The gate terminal of the VDNMOSFET 90 receives the $V_N$ signal. The VDNMOSFET 90 permits a high input level for the $V_N$ signal on the drain terminal of the VDNMOSFET 90 and permits positive going transients while protecting the source terminal of the VDNMOSFET 90 from high transient voltages. The pass gate 14, in some embodiments, also includes a VDNMOSFET transistor 92 that has its drain connected to the input terminal 17 and its source coupled to a positive supply voltage line 59. The voltage of the line 59 (called $V_{PWRC}$) may be less than the $V_{PWRP}$ voltage. For example, in some embodiments, the $V_{PWRC}$ voltage may be about 1.8 volts, and the $V_{PWRC}$ voltage may be about 3.3 volts.

The gate of the VDNMOSFET 92 is coupled to ground, thereby configuring the VDNMOSFET 92 to turn on and clamp the voltage (called IN3VP) on the input terminal 17 when the INV3P voltage exceeds a predetermined level. NMOSFETs 94 and 96 are coupled between the input terminal 17 and ground to bleed, or remove, excess charge present at the input terminal 17. In this manner, the NMOSFET 94 has its drain and gate terminals coupled to the input terminal 17, and the source of the NMOSFET 94 is coupled to the gate and drain terminals of the NMOSFET 96. The source of the NMOSFET 96 is coupled to ground.

The IN3VP voltage controls the bias voltages that are generated by an input reference voltage generation circuit 18 and are used to bias the amplifier 16. In this manner, the circuit 18 includes a MOSFET voltage divider that is formed from PMOSFETs 130, 132, 134 and 136, each of which has its gate terminal coupled to its drain terminal. The source-drain paths of the PMOSFETs 130, 132, 134 and 136 are serially coupled together. The PMOSFET 132 receives a reference voltage (called $V_{REFP}$) at its gate terminal, and the source terminal of the PMOSFET 136 furnishes a bias voltage (called $V_{PCAS}$) and is coupled to the gate and drain terminals of an NMOSFET 138 that is configured as an active load. The source terminal of the NMOSFET 138 is coupled to the source terminal of VDNMOSFET 140 that is coupled to the input terminal 17 of the amplifier 16. Thus, due to this arrangement, the VPCAS and VREFP bias voltages increase and decrease with the IN3VP voltage to avoid stressing components of the amplifier 16.

In some embodiments, the amplifier 16 may include a transconductance amplifier. In this manner, one side of the transconductance amplifier includes a PMOSFET 104 that has its gate terminal coupled to the input signal line 17 of the amplifier 16. The drain terminal of the PMOSFET 104 is coupled to the source of another PMOSFET 108. The drain terminal of the PMOSFET 108 is coupled to an active load formed by a NMOSFET 112 that has its drain terminal coupled to its gate terminal. The gate terminal of the PMOSFET 108 is coupled to the $V_{PCAS}$ bias voltage that is furnished by the voltage reference generation circuit 18. The source terminal of the NMOSFET 112 is coupled to ground. The other side of the differential amplifier is formed from a PMOSFET 114, a PMOSFET 116 and an NMOSFET 117 that are matched and connected in a similar manner to the NMOSFET 106, the PMOSFET 108 and the NMOSFET 112, respectively, with the exception that the gate terminal of the PMOSFET 114 receives the $V_{REFP}$ bias voltage instead of the signal from the input terminal 17.

Among the other features of the amplifier 16, a substantially constant current source supplies current to the source terminals of the PMOSFETs 104 and 114. The current source may be formed from a PMOSFET 103 that has its drain terminal coupled to the source terminals of the PMOSFETs 104 and 114 and its source terminal coupled to the drain terminals of PMOSFETs 100 and 102. The gate terminal of the PMOSFET 102 receives the V160 signal. The source terminals of the PMOSFETs 102 and 100 are coupled to the supply voltage line 59. The gate terminals of the PMOSFET 102 receive voltages to set the current that is supplied to the rest of the amplifier.

The output currents from the transconductance amplifier are formed by two NMOSFETs 118 and 122 that mirror the NMOSFETs 112 and 117, respectively. In this manner, the NMOSFET 118 has its gate terminal coupled to the gate and drain terminals of the NMOSFET 112 to produce a current through the drain-source path of the NMOSFET 118 that mirrors the NMOSFET 112; and the NMOSFET 122 has its gate terminal coupled to the gate and drain terminals of the NMOSFET 117 to produce a current through the drain-source path of the NMOSFET 122 that mirrors the NMOSFET 117. The source of the NMOSFET 118 is coupled to ground, and the drain of the NMOSFET 118 is coupled to an active load formed from a PMOSFET 119. In this manner, the gate terminal of the PMOSFET 119 is coupled to its drain terminal, and the source terminal of the PMOSFET 119 is coupled to the supply voltage line 57.

The current through the PMOSFET 119 is mirrored in a PMOSFET 120 that has its source terminal coupled to the supply voltage line 57 and its gate terminal coupled to the gate terminal of the PMOSFET 119. The drain terminal of the PMOSFET 120 is coupled to the drain terminal of the NMOSFET 122. Due to the above-described arrangement, the drain terminal of the NMOSFET 122 furnishes an inverted indication of the $V_{OUT}$ signal and is coupled to a complimentary metal-oxide-semiconductor (CMOS) inverter that is formed from a PMOSFET 124 and an NMOSFET 126 and provides signal buffering. The drain terminals of the NMOSFET 126 and the PMOSFET 124 furnish the $V_{OUT}$ signal.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A buffer circuit comprising:
    an amplifier;
    a pass gate circuit to communicate an input signal to the amplifier, the pass gate circuit including a terminal to control the communication; and
    a level shifter to furnish a control signal to the terminal of the pass gate circuit and regulate a magnitude of the control signal to be at a first relatively constant level in response to the input signal being within a first range of voltages and to be at a second different relatively constant level in response to the input signal being within a second range of voltages, the pass gate circuit communicating the input signal to the amplifier in response to both the first and second levels.

2. The buffer circuit of claim 1, wherein the pass gate circuit comprises a transistor.

3. The buffer circuit of claim 1, wherein the pass gate circuit comprises a metal-oxide-semiconductor field-effect-transistor and the terminal comprises a gate terminal of the transistor.

4. The buffer circuit of claim 1, wherein the level shifter comprises:
   a voltage-to-current conversion circuit to generate a current indicative of a voltage of the input signal and a resistive element to furnish the control signal in response to the current.

5. The buffer circuit of claim 4, wherein the level shifter further comprises:
   a current source to furnish a predetermined second current to the resistive element.

6. The buffer circuit of claim 1, wherein the amplifier comprises a differential amplifier.

7. A method comprising:
   communicating an input signal to an amplifier using a pass gate circuit;
   providing a control voltage to the pass gate circuit to control communication of the input signal through the pass gate circuit;
   regulating a magnitude of the control voltage to be at a first relatively constant level in response to the input signal being within a first range of voltages and to be at a second different relatively constant level in response to the input signal being within a second range of voltages, the pass gate circuit communicating the input signal to the amplifier in response to both the first and second levels; and
   maintaining the magnitude of the control voltage within a range to cause the pass gate circuit to communicate the input signal to the amplifier.

8. The method of claim 7, wherein the communicating comprises regulating operation of a transistor.

9. The method of claim 7, wherein the communicating comprises regulating operation of a metal-oxide-semiconductor field-effect-transistor.

10. The method of claim 7, further comprising:
    generating a current indicative of a voltage of the input signal; and routing the current through a resistive element to furnish the control voltage in response to the current.

11. The method of claim 10, further comprising:
    furnishing a predetermined second current to the resistive element.

12. The method of claim 11, further comprising:
    adjusting the second predetermined current level based on a voltage range of the input signal.

13. An apparatus comprising:
    a first circuit;
    a pass gate circuit to communicate an input signal to the first circuit, the pass gate circuit including a terminal to receive a control signal to control the communication;
    a voltage-to-current conversion circuit to generate a current to be at a first relatively constant level in response to the input signal being within a first range of voltages and to be at a second different relatively constant level in response to the input signal being within a second range of voltages; and
    a resistive element to furnish the control signal to the terminal in response to the current,
    wherein the pass gate circuit communicates the input signal to the amplifier in response to both the first and second levels of the current.

14. The apparatus of claim 13, wherein the pass gate circuit comprises a transistor.

15. The apparatus of claim 13, wherein the pass gate circuit comprises a metal-oxide-semiconductor field-effect-transistor and the terminal comprises a gate terminal of the transistor.

16. The apparatus of claim 15, wherein the first circuit comprises a differential amplifier.

17. The apparatus of claim 13, further comprising:
    a current source to furnish a predetermined second current to the resistive element.

18. A buffer circuit comprising:
    a first circuit;
    a pass gate circuit coupled to the first circuit, the pass gate circuit including a first terminal to receive an input signal and a control terminal to receive a control signal; and
    another circuit to furnish the control signal to the control terminal of the pass gate circuit and to place the pass gate circuit in an on state in which the pass gate circuit communicates the input signal to the first circuit and regulates the control signal based on a magnitude of the input signal.

19. The buffer circuit of claim 18, wherein the pass gate circuit comprises a transistor.

20. The buffer circuit of claim 18, wherein the pass gate circuit comprises a metal-oxide-semiconductor field-effect-transistor and the control terminal comprises a gate terminal of the transistor.

21. The buffer circuit of claim 18, wherein said another circuit comprises:
    a voltage-to-current conversion circuit to generate a current indicative of a voltage of the input signal and a resistive element to furnish the control signal in response to the current.

22. The buffer circuit of claim 21, wherein said another circuit further comprises:
    a current source to furnish a predetermined second current to the resistive element.

23. The buffer circuit of claim 22, wherein the current source is adjusted to operate in a first mode for a first voltage range of the input signal and in a second mode for a second voltage range of the input signal.

24. The buffer circuit of claim 18, wherein the first circuit comprises an amplifier.

25. The buffer circuit of claim 24, wherein the amplifier comprises a differential amplifier.

26. A method comprising:
    communicating an input signal to a pass gate circuit;
    providing a voltage to the pass gate circuit to place the pass gate circuit in an on state to cause the pass circuit to communicate the input signal to another circuit; and
    regulating a magnitude of the voltage in response to a magnitude of the input signal.

27. The method of claim 26, wherein the regulating comprises regulating operation of a transistor.

28. The method of claim 26, wherein the regulating comprises regulating operation of a metal-oxide-semiconductor field-effect-transistor.

29. The method of claim 26, further comprising:
    generating a current indicative of a voltage of the input signal; and
    routing the current through a resistive element to furnish the voltage in response to the current.

30. The method of claim 29, further comprising:

furnishing a predetermined second current to the resistive element.

31. The method of claim 20, further comprising:

adjusting a level of the second predetermined current based on a voltage range of the input signal.

32. The method of claim 26, wherein said another circuit comprises an amplifier.

* * * * *